(12) United States Patent
Höhenberger et al.

(10) Patent No.: US 12,381,162 B2
(45) Date of Patent: Aug. 5, 2025

(54) PROCESS FOR REDUCING PATTERN-INDUCED WAFER DEFORMATION

(71) Applicant: TEXAS INSTRUMENTS INCORPORATED, Dallas, TX (US)

(72) Inventors: Jonas Höhenberger, Kissing (DE); Gernot Biese, Marzling (DE)

(73) Assignee: Texas Instruments Incorporated, Dallas, TX (US)

(*) Notice: Subject to any disclaimer, the term of this patent is extended or adjusted under 35 U.S.C. 154(b) by 109 days.

(21) Appl. No.: 18/096,704

(22) Filed: Jan. 13, 2023

(65) Prior Publication Data

US 2023/0170314 A1    Jun. 1, 2023

Related U.S. Application Data

(62) Division of application No. 17/030,310, filed on Sep. 23, 2020, now Pat. No. 11,587,889.

(60) Provisional application No. 62/904,448, filed on Sep. 23, 2019.

(51) Int. Cl.
  *H01L 23/00* (2006.01)
  *H01L 21/76* (2006.01)
  *H01L 23/544* (2006.01)

(52) U.S. Cl.
  CPC ............ *H01L 23/564* (2013.01); *H01L 21/76* (2013.01); *H01L 23/544* (2013.01); *H01L 2223/54406* (2013.01); *H01L 2223/54426* (2013.01); *H01L 2223/5446* (2013.01)

(58) Field of Classification Search
  CPC ... H01L 2223/55426; H01L 2223/5446; H01L 2223/54466; H01L 21/76; H01L 21/302; H01L 23/564; H01L 23/544; H01L 23/562; H01L 2223/54406; H01L 2223/54426; H01L 2223/5442; H01L 2223/54433; H01L 23/79
  See application file for complete search history.

(56) References Cited

U.S. PATENT DOCUMENTS

2005/0158966 A1*  7/2005  Fang ................. H01L 21/76229
                                                              257/E23.179
2018/0138101 A1*  5/2018  Yu ......................... H01L 23/481
2019/0311995 A1   10/2019 Ranaweera

* cited by examiner

*Primary Examiner* — Julio J Maldonado
*Assistant Examiner* — Stanetta D Isaac
(74) *Attorney, Agent, or Firm* — Andrew R. Ralston; Frank D. Cimino

(57) ABSTRACT

A semiconductor device wafer includes a plurality of device patterns formed in or over a semiconductor substrate, and a scribe area from which the device patterns are excluded. A plurality of dummy features are located in at least one material level in the scribe area, including over laser scribe dots formed in the semiconductor substrate.

29 Claims, 8 Drawing Sheets

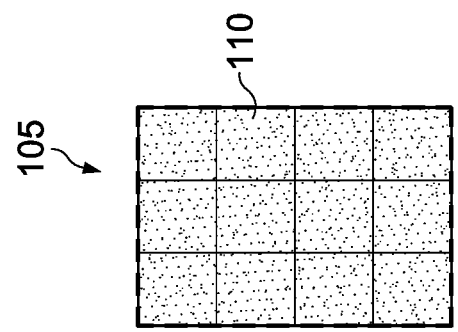
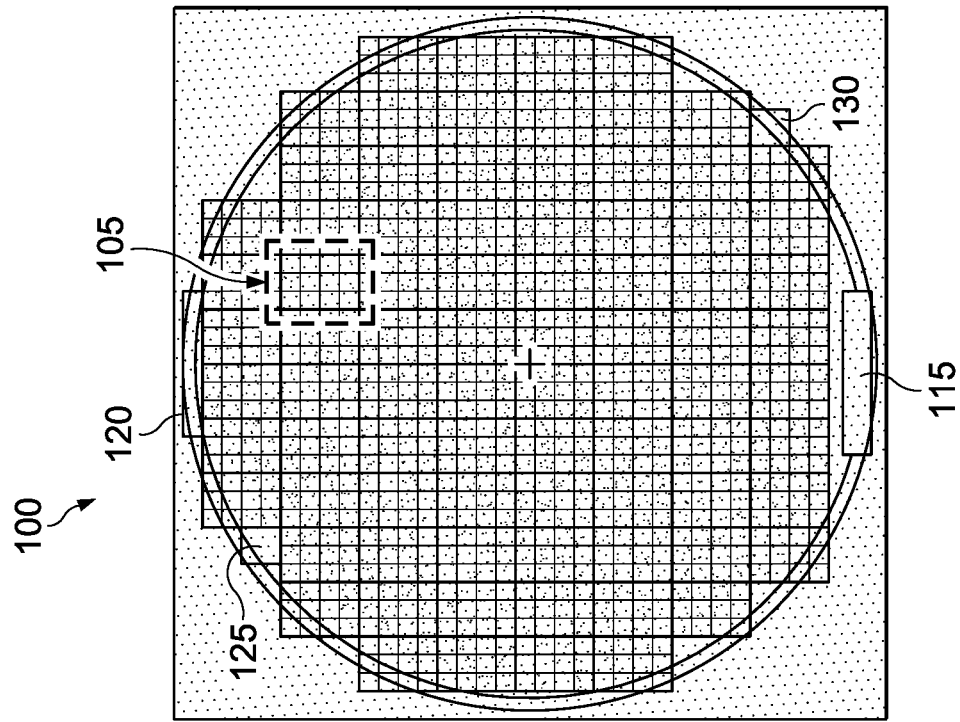
FIG. 1A

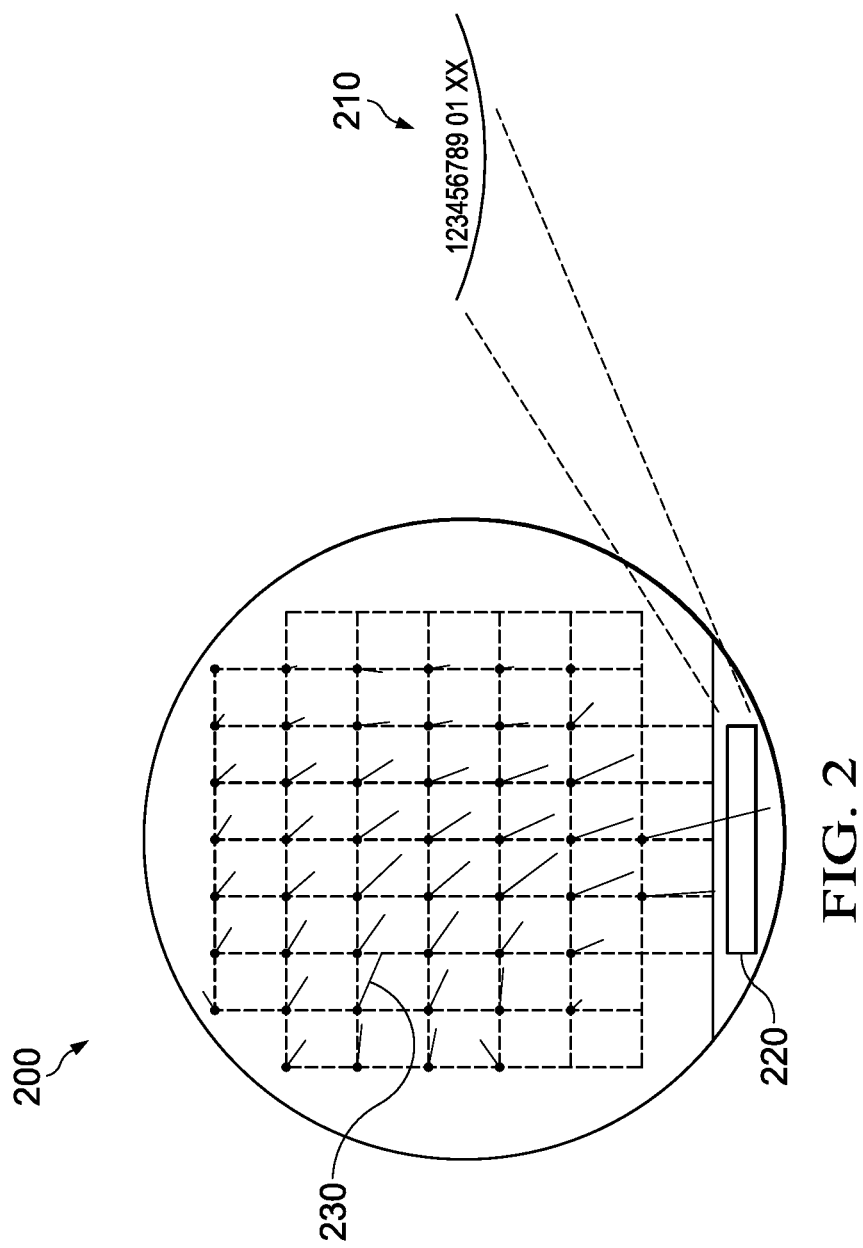

PROCESS FOR REDUCING PATTERN-INDUCED WAFER DEFORMATION

CROSS REFERENCE TO RELATED APPLICATIONS

This application claims priority to U.S. Provisional Application Ser. No. 62/904,448 filed on Sep. 23, 2019, and is a divisional of U.S. Pat. No. 11,587,889, issued Feb. 21, 2023, both of which are incorporated herein by reference in their entireties.

FIELD

This disclosure relates to the field of semiconductor manufacturing, and more particularly, but not exclusively, to reducing substrate stress that may reduce device yield.

BACKGROUND

When forming semiconductor devices, device yield may be reduced by misalignment between patterning layers caused by accumulated stress in the substrate on which the devices are formed. Such stress may also reduce yield by shifting electrical parameters of the devices, even when misalignment is not an issue.

SUMMARY

The inventors disclose various methods and devices that may reduce the effect on device yield of semiconductor wafer stress caused by a discontinuity of pattern density in one or more material layers. While such embodiments may be expected to increase device yield in some cases, no particular result is a requirement of the present invention unless explicitly recited in a particular claim.

In one example a semiconductor device wafer includes a plurality of device patterns formed in or over a semiconductor substrate, and a scribe area from which the device patterns are excluded. A plurality of dummy features are located in at least one material level in the scribe area, including over laser scribe dots formed in the semiconductor substrate.

In another example a method of forming a semiconductor device includes forming a plurality of device patterns in a material level in or over a semiconductor substrate, where each pattern corresponds to an instance of the semiconductor device. The device patterns are excluded from a scribe area of the substrate. A plurality of dummy features are patterned in the material level in said scribe area. The dummy features may be too small to be resolved by an optical recognition system that reads an alphanumeric character sequence or a bar code in the scribe area, thus not interfering with reading the alphanumeric characters.

BRIEF DESCRIPTION OF THE VIEWS OF THE DRAWINGS

FIGS. 1A-1C illustrates an example semiconductor substrate, or wafer, showing a map of exposure shots corresponding to a number of semiconductor devices, and exclusion areas in which dummy features patterns are not conventionally located;

FIG. 2 shows an example semiconductor substrate, with strain vectors showing distortion of the substrate;

DETAILED DESCRIPTION

Figure 1C:
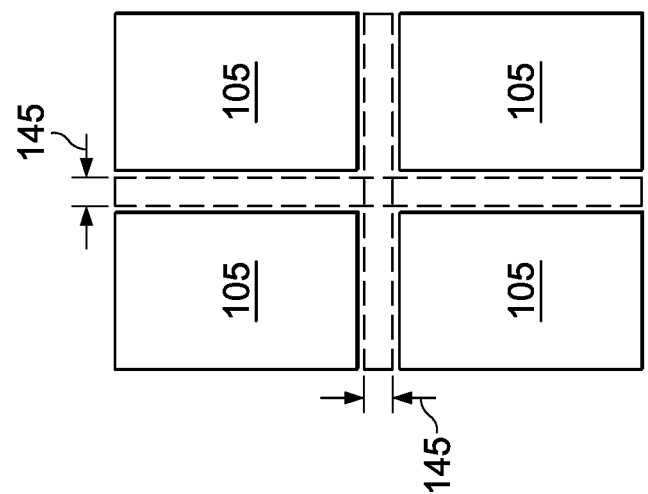

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

In semiconductor processing thermal process steps are used to cure, anneal and/or deposit thin film layers over a semiconductor substrate, e.g. a silicon wafer. Such steps may use rapid thermal anneal (RTA) or other rapid thermal processing methods, which may heat and/or cool the wafer surface very quickly, and possibly heat the bulk material non-homogenously. Under such conditions the wafer surface may expand. Such expansion may be linear or nonlinear. For the case of linear expansion, distances between features on the wafer surface may change as a linear function of distance between the features. On the other hand, for the case of nonlinear expansion, distances between features on the wafer surface may change by a function that includes square or higher-order terms.

In the case of linear expansion, at a photolithography step an optical exposure tool may compensate for such expansion by scaling orthogonal axes of the device, e.g. X and Y axes. However, photolithographic tools typically do not have the ability to compensate for nonlinear effects. When such effects are large enough, misalignment of features between the patterning level to the lower level, there will be an overlay mismatch between the first lithography overlay grid (warped wafer) and the second lithography overlay grid (exposed to match a non-warped wafer). As a consequence previously patterned features may be shifted enough that the corresponding device is nonfunctional, resulting in yield loss.

FIG. 1A illustrates a representative semiconductor substrate 100 with locations of patterning shots 105 and device die 110. In the illustrated example there are 12 device die 110 per shot. These shots represent individual instances of exposure of a pattern reticle by a photolithographic tool such as a stepper. Typically shots are placed on the wafer to pattern to the wafer edge (less an edge-bead exclusion) to improve uniformity of various processes used during manufacturing, e.g. dry etch patterning or chemical mechanical polishing (CMP). The shot pattern may include dummy patterns in addition to device features to further improve process uniformity.

However, conventionally there are sometimes areas of the wafer from which the pattern is excluded. The example of FIG. 1A shows four such exclusion areas. A wafer scribe area 115 is often used by the device manufacturer to identify the wafer by lot and wafer number. A vendor scribe area 120 may be used by the manufacturer of the substrate to identify relevant parameters such as part number or doping type. In both cases an identifier may include alphanumeric characters, a barcode, or another method that uses machine- or human-readable features. Alignment exclusion areas 125 and 130 may be present to assist various tools to recognize wafer position, such as various inspection steps. As described herein various examples provide dummy pattern fill of the areas 115, 120, 125 and 130.

Figure 1B:
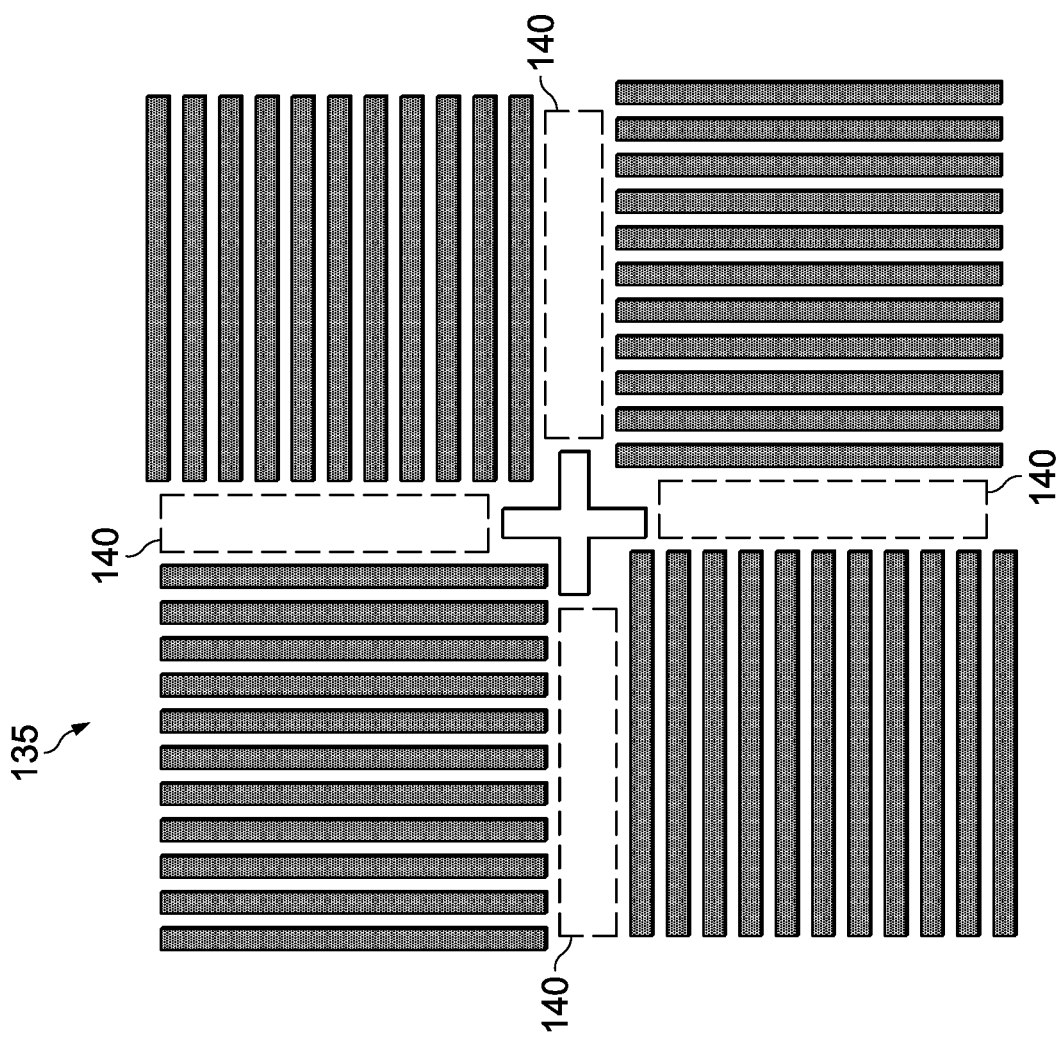

FIG. 1B illustrates ASML alignment marks 135 that are often placed in one or more locations in a pattern reticle. Areas 140 are conventionally left unfilled, but may optionally be filled with dummy pattern as described herein. Similarly, FIG. 1C shows scribe lanes 145 between shots 105. Some features such as parametric test modules and alignment features are often placed in the scribe lanes, with some unused area sometimes remaining. Such open areas may also be filled with dummy pattern as described below.

FIG. 2 illustrates a wafer 200 with a somewhat different shot pattern. An inset figure shows an example wafer scribe 210 in a scribe area 220. The wafer scribe 210 is typically formed by a laser tool that creates in the substrate a dot pattern corresponding to the desired scribe data, each dot having a diameter of about 100 μm. The dot pattern is read at various stages in the manufacturing process by an imaging system that detects edges of the dot patterns and maps the detected edges to the desired character. The shot pattern and dummy features are conventionally excluded from the scribe area 220 to avoid interfering with the pattern recognition by the imaging system. If the vendor scribe area and alignment exclusions are present, the device pattern and dummy features are also excluded from these areas.

The wafer 200 includes displacement vectors 230 determined experimentally for a representative wafer and device pattern. The displacement vectors 130 may be determined from the degree to which the photolithographic tool scales the vertical and horizontal axes when aligning a current pattern level to an underlying pattern level. Each vector 230 has a direction and a magnitude, from which it is observed that the magnitude increases toward the wafer scribe, and becomes increasingly directed toward the wafer scribe. This characteristic is thought to result from the stress discontinuity that results from the pattern exclusion in the wafer scribe area.

Among the pattern levels that may include a dummy feature in the shallow trench isolation (STI) level. Thus the wafer 200 typically includes a relatively uniform distribution of STI features over the entire wafer, with the exception of the exclusion areas. Each STI feature produces an incremental amount of stress in the wafer due to, e.g. having a different thermal expansion coefficient than the semiconductor material of the wafer itself, e.g. silicon. In the aggregate, the STI features may result in wafer stress, or displacement, such as that exemplified by the vectors 230. While the STI level may be particularly prone to producing stress and wafer warping, any patterned material layer may cause warping to some degree.

Figure 3B:
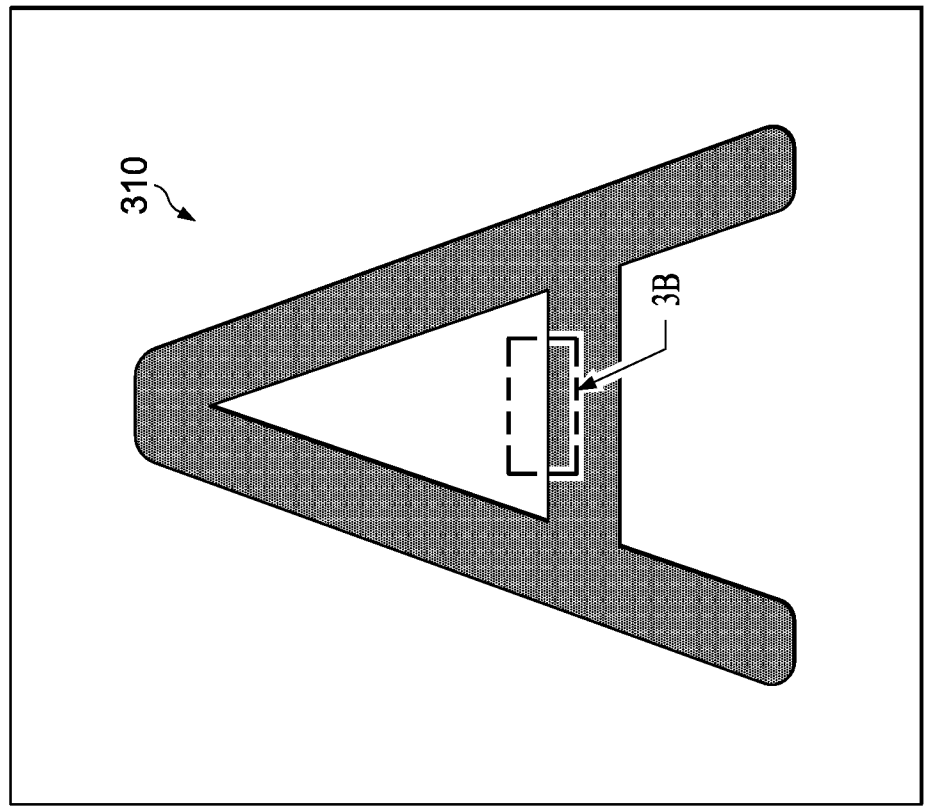
FIGS. 3A and 3B show an alphanumeric character and a background of dummy features.
Figure 3A:
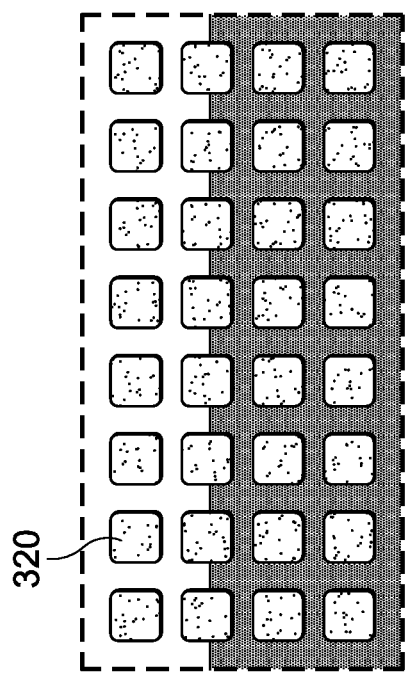

FIG. 3A illustrates a single alphanumeric character 310, an "A", that is representative of characters in the wafer scribe area 110. FIG. 3B shows a magnified portion of FIG. 3A as shown, and includes a portion of the character 310, as well as a number of STI dummy features 320. The dummy features 320 may be uniformly distributed across the entire field of FIG. 3A. Optionally, the dummy features 320 may be patterned within the device patterns, e.g. within the areas 140 and scribe lanes 145. Further optionally the dummy features 320 may be patterned within the alignment exclusion areas 125 and 130, and within the vendor scribe area 120.

The dummy features 320 are small enough to be below the resolution limit of the imaging system used to detect the character 310 and therefore do not interfere with the character recognition. The resolution limit for some such imaging systems may be about 50 μm. The dummy features 320 may be up to 100 μm and provide sufficient contrast to the width the laser scribe marks 420. In other examples the dummy features 320 may be 50 μm or smaller, and therefor below the optical resolution of the laser scribe imaging tool. In other examples the dummy features 320 may be smaller than 50 μm, e.g. on the order of a wavelength of visible light (~0.5 μm), consistent with design rules applied to the wafer being manufactured.

Figure 4A:
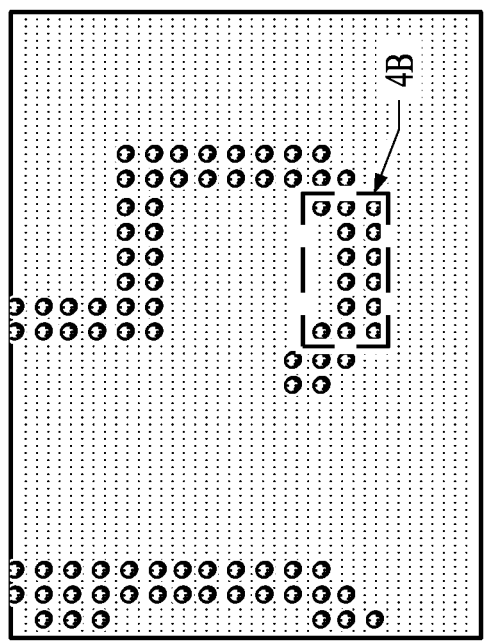
FIG. 4A-4C illustrate optical images of a substrate including a laser dot pattern and dummy features, and example dimensions of such dummy features.
Figure 4B:
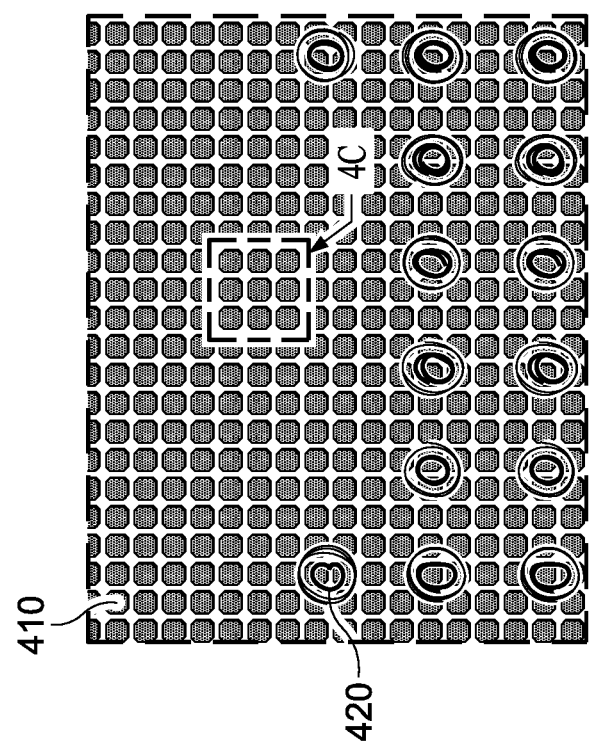

FIG. 4A illustrates a micrograph of a test wafer that includes STI dummy features such as 320. At the scale of FIG. 4A, the dummy features are not easily resolved and form a uniform background. FIG. 4B shows a portion of FIG. 4A at higher magnification, including dummy features 410 and laser scribe marks 420 that form a portion of a character. It is seen in this example that the dummy features 410 are each smaller than a single laser scribe mark 420, and that the laser scribe marks 420 contrast significantly from the dummy features 410. It was determined experimentally that the presence of the dummy features 410 did not interfere with the imaging system detecting the laser scribe characters. In the present example the dummy features 410 are arranged in a square rectilinear array, but other implementations may have other arrangements, e.g. a rectangular array or a hexagonal array.

Figure 4C:
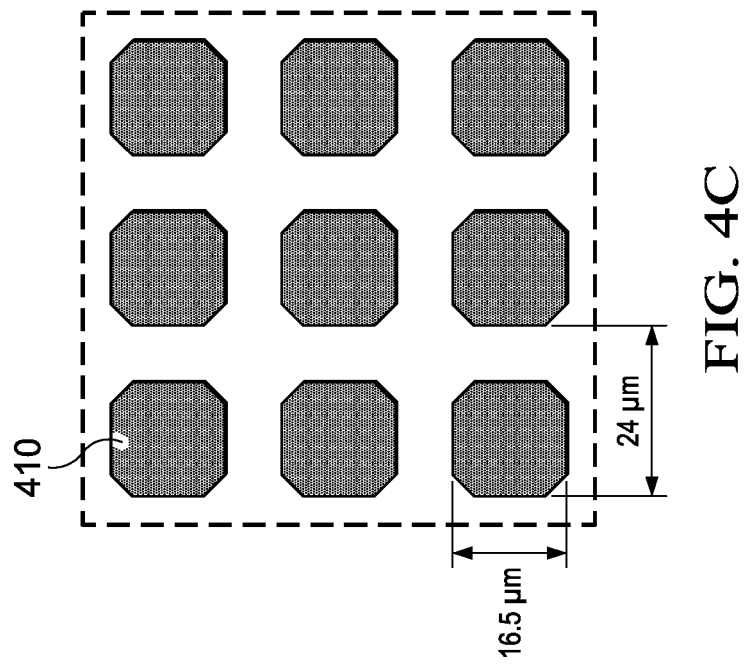

FIG. 4C illustrates width and pitch of the dummy features 410 in a nonlimiting example. In this example, the drawn width of the dummy features 410 is 16.5 μm, and the drawn pitch is 24 μm. These dimensions result in a fill density of about 50%, for example. Other sizes and pitches are possible and contemplated. In one example, the width and pitch may be selected to approximate a fill density of the same pattern level in the device die being formed on the substrate 100, e.g. to approximately match the stress in the wafer scribe area to that in the device. For example, if the fill density of STI features in an instance of the die 110 is 60%, the size and/or pitch of the dummy features 410 could be adjusted to provide a 60% STI fill density in the wafer scribe area.

Figure 5:
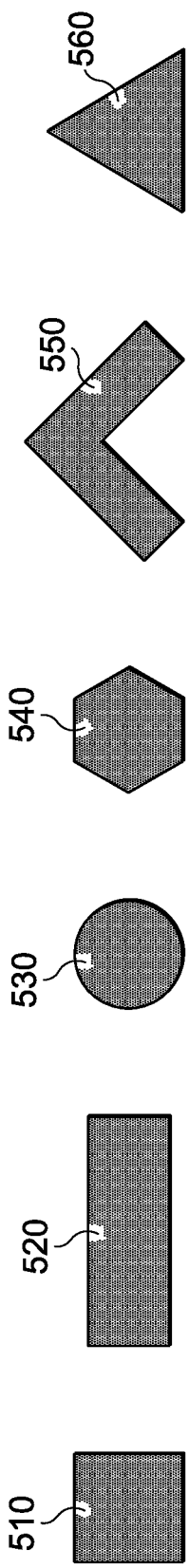
FIG. 5 shows example dummy features that may be used in various examples.

The dummy features 410 may be of any desired geometric shape compatible with relevant design rules. In the illustrated example the dummy features 410 are irregular octagons. As illustrated in FIG. 5, other geometric shapes that may be suitable include squares 510, rectangles 520, circles 530, hexagons 540, chevrons 550 and triangles 560. As previously described the maximum linear dimension of the dummy features 410 may be smaller than the resolution limit of the imaging system used to read the wafer scribe. Thus the square 510 may have a diagonal length of 50 μm or less and the circle 530 may have a diameter of 50 μm or less. This value may depend on the particulars of the imaging system, the material layer in which the dummy features 410 are implemented in, and the pitch of the dummy features 410, but it is expected that a maximum linear dimension of about 100 µm is sufficient in many cases.

While some of the dummy features 410 are collocated with the laser scribe marks 420, in some implementations the laser scribe marks 420 are absent, for example when the dummy features 410 are used in alignment exclusions such as alignment exclusions 150 and 160, or the areas 140 and 145. In some implementations it may be sufficient to use the dummy features 410 only in the wafer scribe area 115 and achieve a significant increase of yield.

The benefit of the presence of the dummy features 410 on the wafer 100 is clear from device yield testing of wafers with and without the dummy features 410. Without the dummy features 410 there is an area of significant yield loss near the wafer scribe area, possibly due to uncorrectable overlay mismatch due to wafer distortion. For the wafer with the dummy features, the area of yield loss is significantly smaller, resulting in an overall yield improvement of about 15%. This yield improvement is highly significant in the context of semiconductor manufacturing, and is an unexpectedly large improvement.

While this discussion has focused on the role of the STI features in causing wafer distortion, it is recognized that any patterned material layer may cause such an effect to some degree. Therefore the principles described with respect to placing sub-resolution dummy features in areas of the wafer, such as the wafer scribe area 115, apply to other material layers, e.g. metal interconnect layers. Furthermore, the described principles may be applied to other types of devices, such as micromechanical devices (e.g. accelerometers) and MEMS devices. Such devices may be formed on a substrate other than a semiconductor substrate, but the described principle of wafer deformation due to deep etches is analogous in such implementations.

Figure 6:
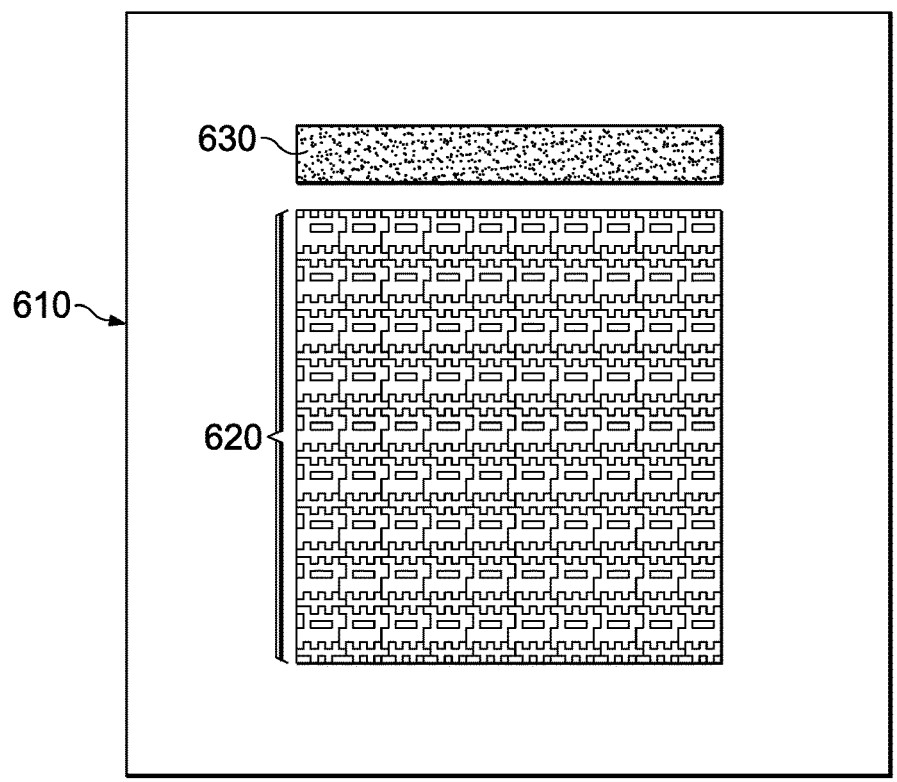
FIG. 6 shows an example reticle including a device pattern and a dummy field pattern.

The dummy features 410 may be patterned in at least two ways. FIG. 6 illustrates a reticle 610 that includes a device pattern area 620 and a dummy pattern area 630. Note that the device pattern area 620 includes multiple instances of a particular device pattern. In this example, during exposure of a resist layer on a wafer the dummy pattern area 630 may be fenced off such that only the device pattern area 620 is exposed on the wafer. After completion of the device pattern area 620 may be fenced off and the dummy pattern are 630 used to expose the wafer scribe area. Implementing the reticle 610 in this manner advantageously avoids the expense of a separate mask for the dummy features 410, and further avoids setup time loading a second mask into the photolithographic tool.

Figure 7A:
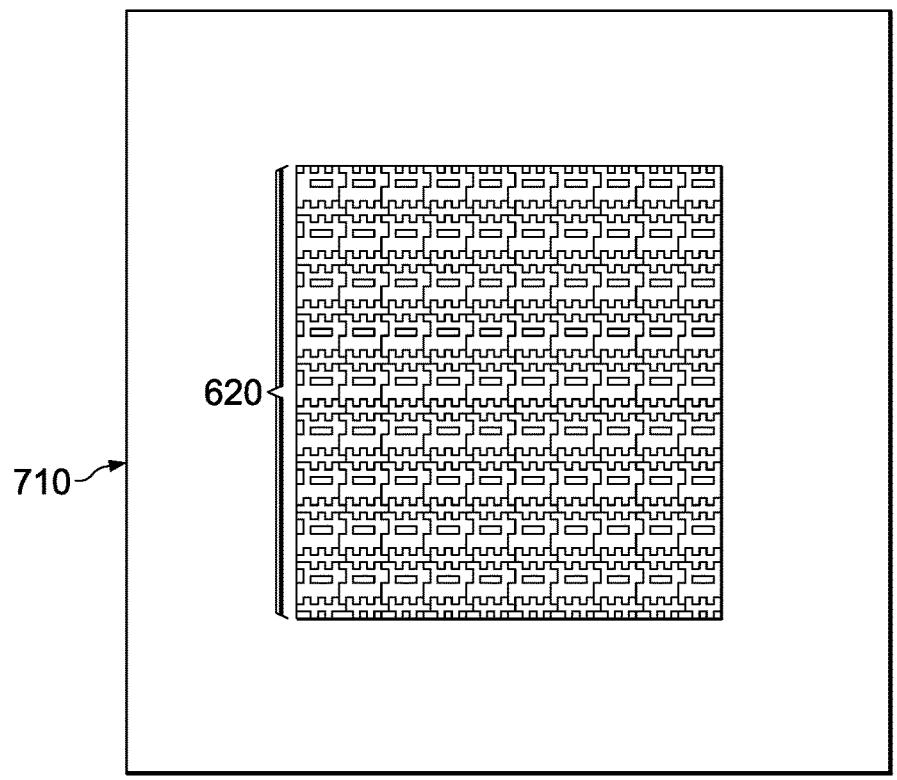
FIGS. 7A and 7B show a first example reticle including only a device pattern, and a second example reticle including only a dummy field pattern.
Figure 7B:
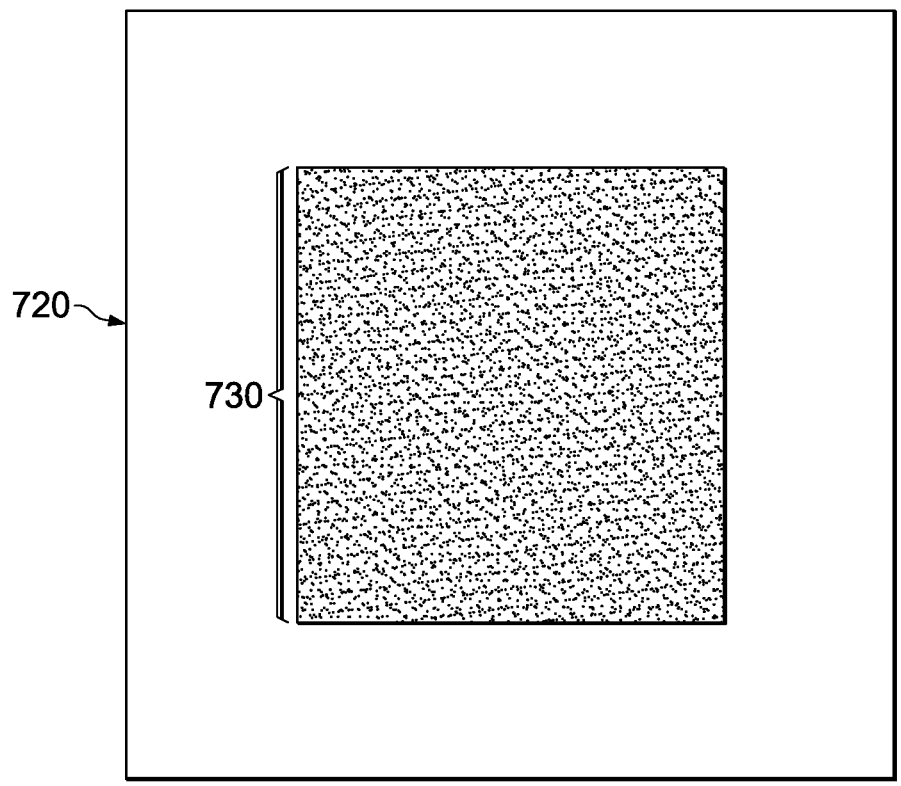

FIGS. 7A and 7B illustrate an alternate approach in which a reticle 710 is produced that only includes the device pattern area 620. A reticle 720 is produced that includes a pattern 730 of dummy features 410 that can in principle be as large as the largest pattern the reticle 720 can accommodate. In an implementation using the reticles 710 and 720, the reticle 710 may be used to expose a resist layer with the desired number of shots. The photolithographic tool may then be reconfigured to use the reticle 720, from which the desired areas of the resist layer are exposed to produce the dummy features 410. Alternatively the reticle 720 may be used, followed by the reticle 710. Implementing the reticles 710 and 720 in either of these manners may be advantageous when large areas of the wafer are to be patterned with the dummy features 410, as a lesser number of shots may be needed to create the desired pattern.

Figure 8:
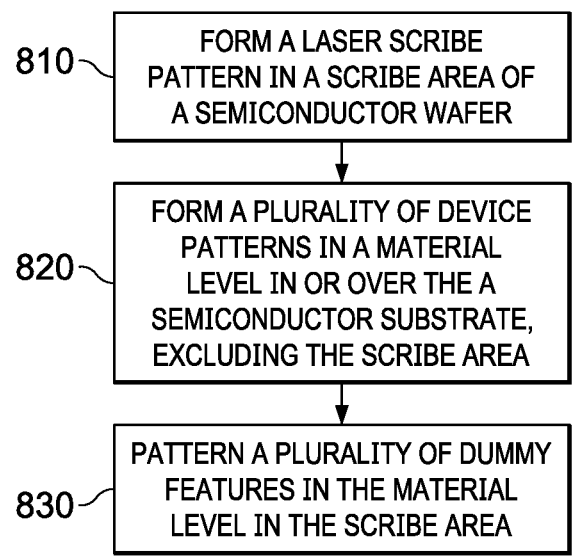
FIG. 8 provides an example method of manufacturing a semiconductor device according to the disclosure.

Turning to FIG. 8, a method of manufacturing a semiconductor device is presented according to the principles of the disclosure. In a step 810 a laser scribe pattern is formed in a scribe area of a semiconductor wafer. The laser scribe pattern may be consistent with that described by FIG. 4A, e.g. ~100 µm dots formed by a focused laser that produces a pattern that may be recognized as an alphanumeric character or a barcode representation. In a step 820 a plurality of device patterns are formed in a material level over the semiconductor substrate, including for the semiconductor device, excluding the wafer scribe area. In a step 830 a plurality of dummy features are patterned in the material layer in the scribe area, including some dummy features located over the laser scribe pattern. As described previously the dummy features may have a longest linear dimension no larger than 50 µm, may be as large as 100 µm, or on the order of a wavelength of visible light. Optionally, dummy features may be patterned within the device patterns, e.g. within scribe lanes and/or alignment masks. Further optionally dummy features may be patterned within alignment exclusion areas and vendor scribe areas.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

The invention claimed is:

1. A semiconductor device wafer, comprising:
   a plurality of device patterns formed in or over a semiconductor substrate having an edge at an outer perimeter of the substrate, the device patterns being arranged in an array of rows and columns;
   a scribe area from which said device patterns are excluded, the scribe area being located between a topmost row of the device patterns and the edge of the semiconductor substrate, or between a bottommost row of the device patterns and the edge of the semiconductor substrate; and
   a plurality of dummy features formed in at least one material level over the substrate in said scribe area, a longest dimension of the dummy features being shorter than a width of the device patterns.

2. The semiconductor device wafer of claim 1, wherein a subset of said dummy features are located over laser scribe marks.

3. The semiconductor device wafer of claim 1, wherein said dummy features are no longer than 25 µm in any linear dimension.

4. The semiconductor device wafer of claim 1, wherein said dummy features have a longest linear dimension in a range between 10 µm and 100 µm.

5. The semiconductor device wafer of claim 1, wherein said dummy features are implemented in a shallow trench isolation (STI) layer.

6. The semiconductor device wafer of claim 1, wherein said dummy features comprise irregular octagons.

7. The semiconductor device wafer of claim 1, wherein said dummy features comprise chevrons.

8. The semiconductor device wafer of claim 1, wherein said dummy features are formed in a shallow trench isolation layer of the device wafer.

9. The semiconductor device wafer of claim 1, wherein an areal density of said dummy features is about equal to an areal density of a device pattern formed in the material level in the device patterns.

10. The semiconductor device wafer of claim 1, wherein the dummy features are arranged in a regular array.

11. A method of forming a semiconductor device, comprising:

forming a plurality of device patterns in a material level in or over a semiconductor substrate having an edge at an outer perimeter of the substrate, the device patterns being arranged in an array of rows and columns, each pattern corresponding to an instance of the semiconductor device;

excluding said device patterns from a wafer scribe area over the substrate, the wafer scribe area being located between a topmost row of the device patterns and the edge of the semiconductor substrate, or between a bottommost row of the device patterns and the edge of the semiconductor substrate; and patterning a plurality of dummy features in the material level in said wafer scribe area, a longest dimension of the dummy features being shorter than a width of the device patterns.

12. The method of claim 11, wherein said patterning includes employing a single photolithographic reticle that includes an instance of the device patterns, and a separate area including a pattern corresponding to the plurality of dummy features.

13. The method of claim 11, wherein said dummy features are no longer than 25 µm in any linear dimension.

14. The method of claim 11, wherein said dummy features have a longest linear dimension in a range between 10 µm and 100 µm.

15. The method of claim 11, wherein said dummy features comprise regular polygons.

16. The method of claim 11, wherein said dummy features comprise irregular octagons.

17. The method of claim 11, wherein said dummy features comprise chevrons.

18. The method of claim 11, wherein said dummy features are formed in a shallow trench isolation layer over the substrate.

19. The method of claim 11, wherein an areal density of said dummy features is about equal to an areal density of a device pattern formed in the material level in the device patterns.

20. The method of claim 11, wherein the dummy features are arranged in a regular array.

21. The method of claim 11, wherein a subset of said dummy features are formed over laser scribe marks.

22. A method of forming a semiconductor device, comprising:

forming a plurality of device patterns in a material level in or over a semiconductor wafer, each pattern corresponding to an instance of the semiconductor device, the plurality of device patterns arranged in an array of rows and columns;

excluding the device patterns from a wafer scribe area over the semiconductor wafer that spans a plurality of columns of the device patterns; and patterning a plurality of dummy features in the material level in the scribe area, a longest dimension of the dummy features being shorter than a width of the device patterns.

23. The method of claim 22, wherein the scribe area includes a laser scribe pattern that includes a lot number of the semiconductor wafer.

24. The method of claim 22, wherein the scribe area includes a laser scribe pattern that includes a wafer number of the semiconductor wafer.

25. The method of claim 22, wherein the scribe area includes a vendor scribe pattern.

26. A semiconductor device wafer, comprising:

a plurality of device patterns formed in or over a semiconductor substrate, the device patterns being arranged in an array of rows and columns;

a scribe area over the substrate from which said device patterns are excluded, the scribe area spanning a plurality of columns of the device patterns; and a plurality of dummy features formed in at least one material level in said scribe area, a longest dimension of the dummy features being shorter than a width of the device patterns.

27. The semiconductor device wafer of claim 26, wherein the scribe area includes a laser scribe pattern that includes a lot number of the semiconductor substrate.

28. The semiconductor device wafer of claim 26, wherein the scribe area includes a laser scribe pattern that includes a wafer number of the semiconductor substrate.

29. The semiconductor device wafer of claim 26, wherein the scribe area includes a vendor scribe pattern.

* * * * *